US010679998B2

(12) United States Patent
Cheng et al.

(10) Patent No.: US 10,679,998 B2
(45) Date of Patent: Jun. 9, 2020

(54) VERTICAL FIELD EFFECT TRANSISTOR INCLUDING INTEGRATED ANTIFUSE

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 150 days.

(21) Appl. No.: 15/486,599

(22) Filed: Apr. 13, 2017

(65) Prior Publication Data

US 2018/0061845 A1    Mar. 1, 2018

Related U.S. Application Data

(62) Division of application No. 15/247,267, filed on Aug. 25, 2016, now Pat. No. 10,229,919.

(51) Int. Cl.
*H01L 27/112* (2006.01)
*H01L 23/525* (2006.01)
*H01L 29/51* (2006.01)
*H01L 29/423* (2006.01)
*H01L 27/12* (2006.01)
(Continued)

(52) U.S. Cl.
CPC ........ *H01L 27/11206* (2013.01); *G11C 17/16* (2013.01); *G11C 17/18* (2013.01); *H01L 23/5252* (2013.01); *H01L 27/1203* (2013.01); *H01L 29/0847* (2013.01); *H01L 29/42368* (2013.01); *H01L 29/42392* (2013.01); *H01L 29/512* (2013.01); *H01L 29/66666* (2013.01); *H01L 29/66795* (2013.01); *H01L 29/785* (2013.01); *H01L 29/78618* (2013.01); *H01L 29/78642* (2013.01)

(58) Field of Classification Search
None
See application file for complete search history.

(56) References Cited

U.S. PATENT DOCUMENTS 5,266,829 A    11/1993  Hamdy et al.
5,414,289 A     5/1995  Fitch et al.
(Continued)

OTHER PUBLICATIONS

List of IBM Patents or Patent Applications Treated as Related; (Appendix P), Filed Jul. 5, 2017; 2 pages.
(Continued)

*Primary Examiner* — Hoang-Quan Ho
(74) *Attorney, Agent, or Firm* — Cantor Colburn LLP; Vazken Alexanian

(57) ABSTRACT

A vertical field effect transistor (FET) includes a vertical semiconductor channel having a first end that contacts an upper surface of a substrate and an opposing second end that contacts a source/drain region. An electrically conductive gate encapsulates the vertical semiconductor channel. The vertical FET further includes a split-channel antifuse device between the source/drain region and the electrically conductive gate. The split-channel antifuse device includes a gate dielectric having a thickness that varies between the source/drain region and the electrically conductive gate.

10 Claims, 15 Drawing Sheets

(51) Int. Cl.
*H01L 29/66* (2006.01)
*H01L 29/08* (2006.01)
*H01L 29/786* (2006.01)
*H01L 29/78* (2006.01)
*G11C 17/16* (2006.01)
*G11C 17/18* (2006.01)

(56) References Cited

U.S. PATENT DOCUMENTS

| | | |
|---|---|---|
| 6,268,621 B1 | 7/2001 | Emmi et al. |
| 6,509,624 B1 | 1/2003 | Radens et al. |
| 6,570,207 B2 | 5/2003 | Hsu et al. |
| 7,242,057 B2 | 7/2007 | Tang et al. |
| 7,755,162 B2 | 7/2010 | Kurjanowicz et al. |
| 7,777,264 B2 | 8/2010 | Voshell et al. |
| 8,779,492 B2 | 7/2014 | Takaishi et al. |
| 9,112,017 B2 | 8/2015 | Banerjee et al. |
| 9,159,734 B2 | 10/2015 | Hafez et al. |
| 9,431,497 B2 | 8/2016 | Toh et al. |
| 9,443,982 B1 | 9/2016 | Balakrishnan et al. |
| 2005/0148137 A1 | 7/2005 | Brask et al. |
| 2006/0043471 A1* | 3/2006 | Tang ............... H01L 29/42392 257/328 |
| 2008/0090361 A1* | 4/2008 | Anderson ......... H01L 29/42384 438/283 |
| 2014/0179070 A1 | 6/2014 | Yang |
| 2014/0346603 A1 | 11/2014 | Toh et al. |

OTHER PUBLICATIONS

Kangguo Cheng, "Vertical Field Effect Transistor Including Integrated Antifuse", U.S. Appl. No. 15/247,267, filed Aug. 25, 2016.
Cheng et al., "Vertical Field Effect Transistor Including Integrated Antifuse," U.S. Appl. No. 15/247,267, filed Aug. 25, 2016.
Cheng et al., "Vertical Field Effect Transistor Including Integrated Antifuse," U.S. Appl. No. 16/225,368, filed Dec. 19, 2018.
List of IBM Patents or Patent Applications Treated as Related; (Appendix P), Date Filed Dec. 20, 2018; 2 pages.

* cited by examiner

VERTICAL FIELD EFFECT TRANSISTOR INCLUDING INTEGRATED ANTIFUSE

DOMESTIC PRIORITY

This application is a divisional of U.S. patent application Ser. No. 15/247,267, filed Aug. 25, 2016, the disclosure of which is incorporated by reference herein in its entirety.

BACKGROUND

The present invention relates to semiconductor devices, and more specifically, to vertical-type field effect transistors.

As demands to reduce the dimensions of transistor devices continue, new designs and fabrication techniques to achieve a reduced device footprint are developed. Vertical-type field effect transistors (vertical FETs) have recently been developed to achieve a reduced FET footprint without compromising the necessary FET performance. These vertical FETs are fabricated such that source/drain (S/D) regions are arranged at opposing ends of a vertical channel region, which reduces the overall device footprint.

The reduced footprint of vertical FETs makes them desirable for use in system-on-chip (SOC) applications, which provide increased component density and integration of numerous functions onto a single silicon chip. One such example of a SOC application is the implementation of antifuses to form on-chip one-time programmable (OTP) memory cells.

SUMMARY

According to a non-limiting embodiment of the present invention, a vertical field effect transistor (FET) includes a vertical semiconductor channel having a first end that contacts an upper surface of a substrate and an opposing second end that contacts a source/drain region. An electrically conductive gate encapsulates the vertical semiconductor channel. The vertical FET further includes a split-channel antifuse device between the source/drain region and the electrically conductive gate. The split-channel antifuse device includes a gate dielectric having a thickness that varies between the source/drain region and the electrically conductive gate.

According to another embodiment, a semiconductor memory cell comprises a substrate extending along a first direction to define a length and second direction opposite the first direction to define a width. A vertical semiconductor channel extends between first and second opposing ends along a third direction opposite the first and second directions. The first end is on an upper surface of the substrate and the second end contacts a source/drain region. An electrically conductive gate encapsulates the vertical semiconductor channel. The vertical semiconductor channel has a split-channel gate dielectric interposed between the vertical semiconductor channel and the electrically conductive gate. The split-channel gate dielectric includes a first dielectric layer having a first thickness and a second dielectric having a second thickness that is different from the first thickness.

According to yet another embodiment, a method of integrating an antifuse device with a vertical field effect transistor (FET) comprises forming a vertical semiconductor channel on an upper surface of a semiconductor substrate, and forming a split-channel gate dielectric on the outer surface of the vertical semiconductor channel. The method further comprises forming an electrically conductive gate that encapsulates the split-channel gate dielectric and the vertical semiconductor channel, wherein forming the split-channel gate dielectric includes forming a first dielectric layer having a first thickness and forming a second dielectric layer having a second thickness greater than the first thickness.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 1-14 are a series of views illustrating a method of fabricating an antifuse-integrated vertical FET according to various non-limiting embodiments, in which:

FIG. 1 is a cross-sectional view of a starting semiconductor-on-insulator substrate including a buried insulator layer interposed between a bulk semiconductor layer and an active semiconductor layer;

FIG. 2 illustrates the starting semiconductor substrate of FIG. 1 following deposition of a hardmask layer atop the active semiconductor layer;

FIG. 3 illustrates the starting semiconductor substrate of FIG. 2 after patterning the active semiconductor layer to form an intermediate semiconductor device including vertical semiconductor channels on an upper surface of the buried insulator layer;

FIG. 4 illustrates the intermediate semiconductor device of FIG. 3 following deposition of a first dielectric layer on an outer surface of the buried insulator layer, along with on the outer surfaces of the vertical channels and remaining hardmask caps;

FIG. 5 illustrates the intermediate semiconductor device of FIG. 4 following formation of an electrically conductive gate handle atop the first dielectric layer;

FIG. 6 illustrates the intermediate semiconductor device of FIG. 5 following deposition of a second dielectric layer to form a thick dielectric layer that lines the upper surface of the gate handle along with the outer surfaces of the vertical channels and remaining hardmask caps;

FIG. 7 illustrates the intermediate semiconductor device of FIG. 6 after depositing a masking liner that conforms to the outer surface of the thick dielectric layer;

FIG. 8 illustrates the intermediate semiconductor device of FIG. 7 following a directional etching process to remove portions of the masking liner and thick dielectric layer from upper surfaces of the gate handle and hardmask caps;

FIG. 9 illustrates the intermediate semiconductor device of FIG. 8 following a selective etching process to remove remaining portions of the masking liner from the thick dielectric layer;

FIG. 10 illustrates the intermediate semiconductor device of FIG. 9 after depositing an electrically conductive filing material to cover the vertical channels and thick dielectric layers;

FIG. 11 illustrates the intermediate semiconductor device of FIG. 10 following a planarization process that recesses a portion of the electrically conducting filing material and the hardmask caps to form an electrically conductive gate;

FIG. 12 illustrates the intermediate semiconductor device of FIG. 11 after depositing a bulk spacer layer atop the gate to cover the vertical channels and thick dielectric layers;

FIG. 13 illustrates the intermediate semiconductor device of FIG. 12 following a planarization process that recesses bulk spacer layer to form spacers atop the gate; and FIG. 14 illustrates the intermediate semiconductor device of FIG. 13 after epitaxially growing source/drain regions atop the vertical channels to form an antifuse-integrated vertical FET according to a non-limiting embodiment.

FIGS. 15 and 16 are schematic diagrams of an antifuse-integrated vertical FET according to a non-limiting embodiment, in which:

FIG. 15 is a schematic diagram of the antifuse-integrated vertical FET operating in a non-programmed mode; and FIG. 16 is a schematic diagram of the antifuse-integrated vertical FET operating in a programmed mode following dielectric breakdown of the thin dielectric layer included in the split-channel gate dielectric provided by at least one non-limiting embodiment of the invention.

DETAILED DESCRIPTION

Figure 1:
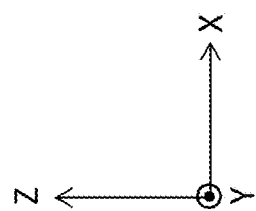
Figure 1:
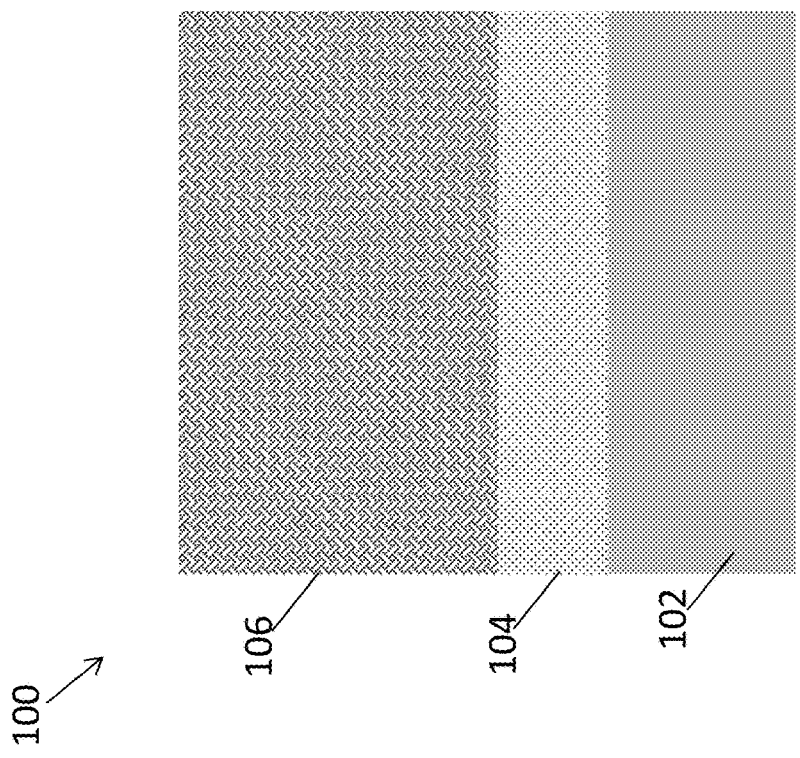

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique.

Thus, the unique combination of the operations described in connection with the present invention utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of one or more embodiments of the present invention, a vertical FET is provided having an integrated antifuse device. In general, an antifuse is an electrical device that performs the opposite function to a fuse. Whereas a fuse starts with a low resistance and is designed to permanently break an electrically conductive path in response to the current through the path exceeding a specified limit, an antifuse starts with a high resistance and is designed to permanently create an electrically conductive path in response to the voltage across the antifuse exceeding a certain level.

According to one or more non-limiting embodiments, the vertical FET has a split-channel gate dielectric including a thin gate dielectric layer and a thick gate dielectric layer. In general, dielectrics inherently possess an individual dielectric breakdown threshold based on their material composition. The dielectric experiences dielectric breakdown, also referred to as electrical breakdown, occurs when the voltage across the dielectric exceeds the dielectric breakdown threshold. In addition to the type of material used to form the dielectric, the dimensions of the dielectric (e.g., the thickness) can also influence the breakdown threshold. Unlike conventional gate dielectrics, the split-channel gate dielectric described herein includes multiple layers having different thickness dimensions. In one more embodiments, the multiple layers having different thickness dimension include a thin dielectric layer and a thick dielectric layer which. The arrangement of the thin layer dielectric layer and the thick dielectric layer allows for controlling the location of dielectric breakdown. In addition, the structure of the antifuse-integrated vertical FET achieves a reduced footprint compared to conventional antifuse devices, thereby facilitating increases in component density and integration of numerous functions, which are desirable to advance SOC applications.

With reference now to FIG. 1, a starting semiconductor substrate 100 is illustrated. The starting semiconductor structure 100 extends along a first axis (e.g., a Z-axis) to define a vertical height, a second axis (e.g., an X-axis) to define a distance of a first side (i.e., a first side distance), and a third axis (Y-axis) to define a distance of a second side (i.e., a second side distance). The starting substrate 100 is formed as a semiconductor-on-insulator (SOI) substrate 100 including a bulk semiconductor layer 102, a buried insulator layer 104, and an active semiconductor layer 106.

The buried insulator layer 104 is formed atop the bulk semiconductor layer 102, and the active semiconductor layer 106 is formed atop the buried insulator layer 104. Accordingly, the buried insulator layer 104 is interposed between the bulk semiconductor layer 102 and the active semiconductor layer 106. The bulk semiconductor layer 102 is formed from silicon (Si), for example. The buried insulator layer 104 can be formed from various electrically insulative materials including, for example, silicon dioxide ($SiO_2$). The buried insulator layer 104 has a vertical thickness (i.e., extending along the Z-axis) ranging from approximately 10 nanometers (nm) to approximately 200 nm. The active semiconductor layer 106 can be formed from various semiconductor materials including, but not limited to, Si. The vertical thickness of the active semiconductor layer 106 ranges from approximately 40 nm to approximately 60 nm. Although a SOI substrate 100 is discussed herein, it should be appreciated that the starting substrate 100 can be formed as a bulk semiconductor substrate without departing from the scope of the invention.

Figure 2:
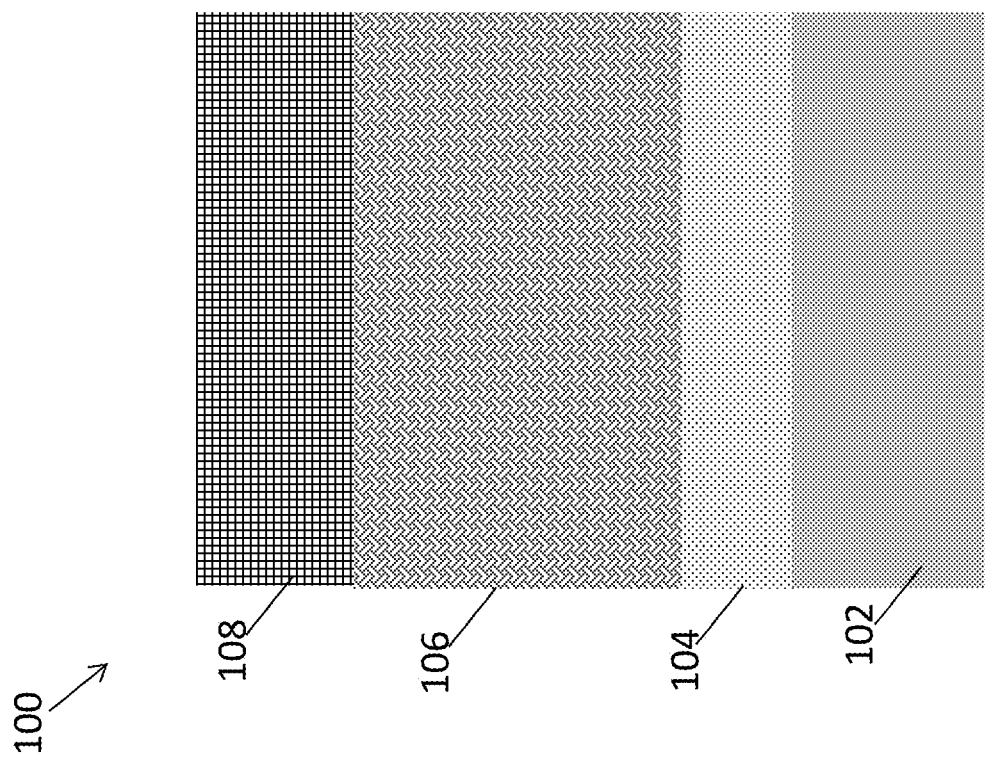

Referring to FIG. 2, a hardmask cap layer 108 is formed atop the active semiconductor layer 106. The hardmask cap layer 108 can be formed from various dielectric materials capable of protecting underlying layers during one or more subsequent etching processes. In one or more embodiments, the hardmask cap layer 108 is formed from silicon nitride (SiN) and has a vertical thickness ranging from approximately 20 nm to approximately 50 nm. Prior to forming the hardmask cap layer 108, an optional hardmask blocking layer (not shown) formed of silicon dioxide ($SiO_2$), for example, can be deposited on the upper surface of the active semiconductor layer 106. Accordingly, the optional hardmask blocking layer is interposed between the active semiconductor layer 106 and the hardmask cap layer 108. The hard mask blocking layer can provide reflection control, surface energy matching, and improved pattern transfer capabilities when performing subsequent lithography and patterning processes.

Figure 3:
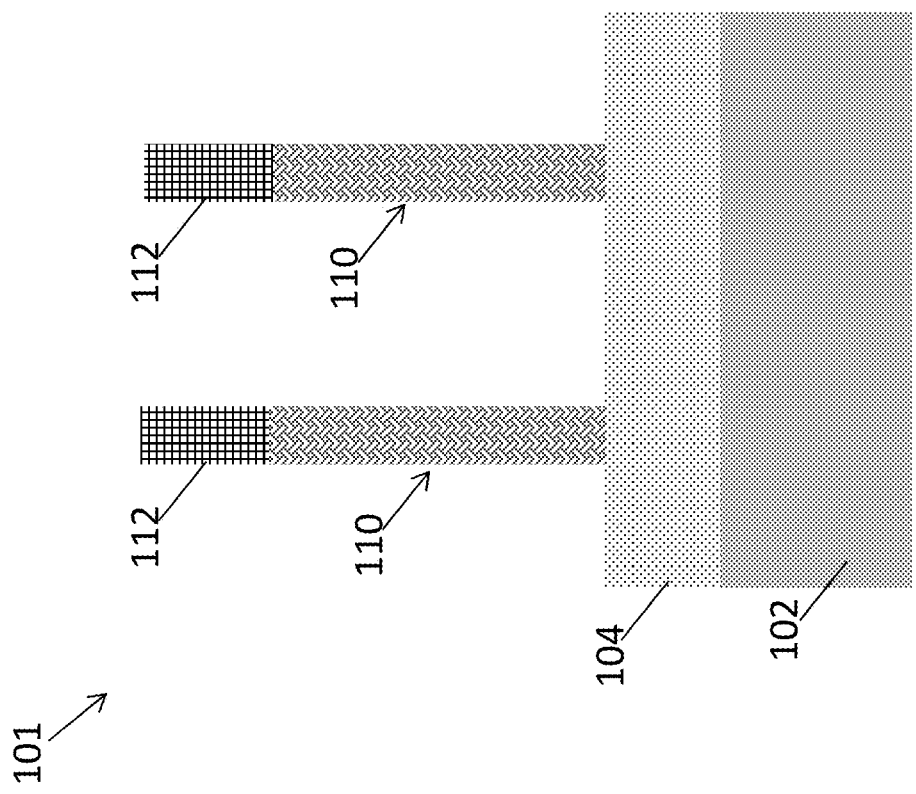

Turning to FIG. 3, an intermediate semiconductor device 101 is illustrated after patterning the SOI substrate (previously indicated as element 100 in FIG. 1) to form vertical semiconductor channels 110 (hereinafter referred to as vertical channels 110) atop the buried insulator layer 104. The vertical channels 110 have a thickness (e.g., extending along the X-axis) ranging from about 8 nanometers (nm) to about 10 nm, and a height (extending along the Z-axis) ranging from about 16 nm to about 20 nm.

One or more patterning process can be performed to form the vertical channels 110. The patterning process typically involves the deposition and patterning of a suitable photoresist (not shown). The hardmask cap layer 108 can then be patterned selective to the developed photoresist to define a desired vertical channel pattern.

Exposed portions of the active semiconductor layer 106 are then etched while covered portions of the active semiconductor layer 106 located beneath the remaining portions of the hardmask cap layer 108 are preserved. In one or more embodiments, a directional (i.e., anisotropic) RIE process that is selective to semiconductor material (e.g., Si) is used to etch the uncovered active semiconductor layer 106 while stopping on an upper surface of the buried insulator layer 104. In this manner, the pattern of the hardmask cap layer 108 is transferred into the active semiconductor layer 106 to form the vertical channels 110 as shown in FIG. 3. Although two vertical channels 110 are shown, any number of vertical channels 110 can be formed without departing from the scope of the invention. The length and width of the patterning can be selected according to a desired fin size/shape for the particular application. The remaining hardmask cap 112 can be maintained atop the vertical channels 110, and can be used to protect the vertical channels 110 during subsequent processing.

Figure 4:
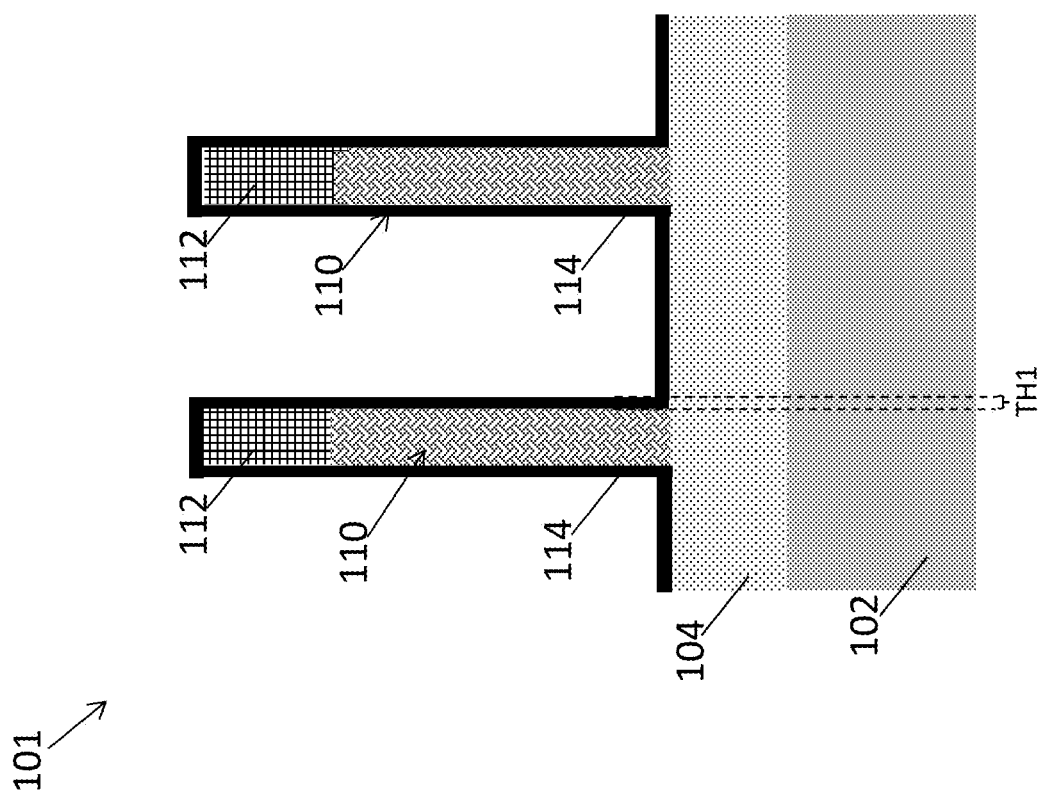

Turning now to FIG. 4, a first dielectric layer 114 (e.g., a thin dielectric layer 114) is deposited on the upper surface of the exposed buried insulation layer 104, along with the outer surfaces of the vertical channels 110 and the hardmask caps 112. The thin dielectric layer 114 is formed from a high-dielectric constant (high-k) material such as hafnium oxide ($HfO_2$), for example. The thickness (TH1) of the thin dielectric layer 114 ranges, for example, from approximately 1 nm to approximately 2 nm. Various deposition processes can be used to deposit the thin dielectric layer 114. For example, an ion radical assisted deposition (iRAD) process can be performed to deposit a thin dielectric layer 114 that lines the exposed surfaces of the buried oxide layer 104, the vertical channels 110 and the hardmask caps 112.

Figure 5:
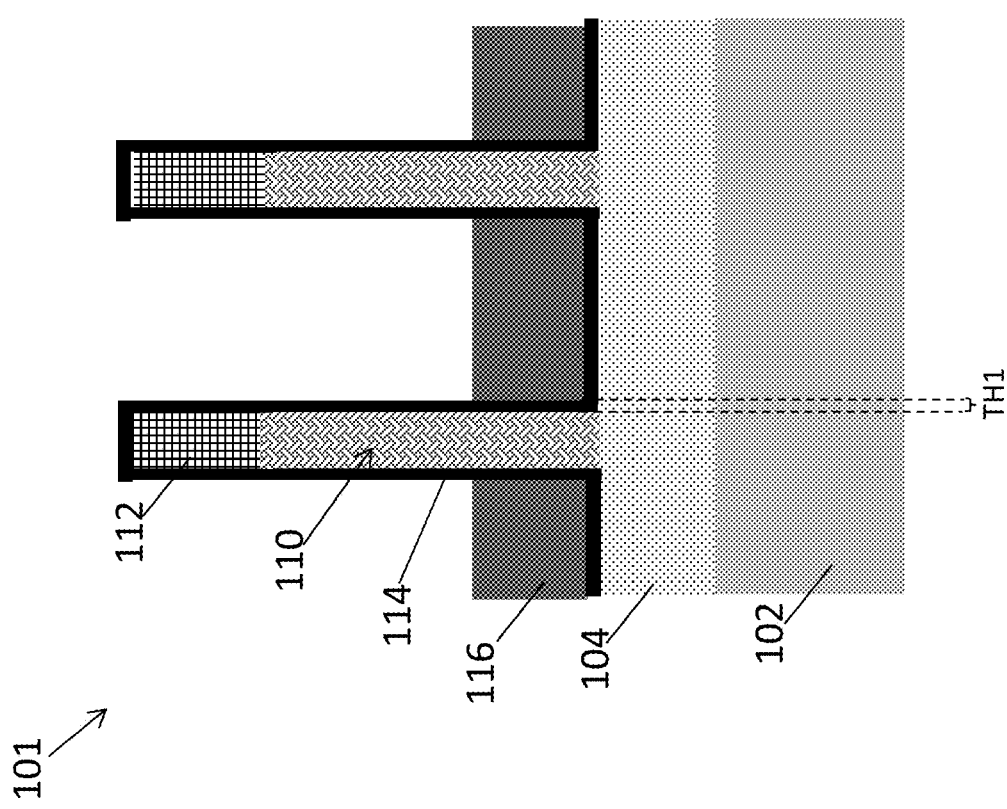

Referring to FIG. 5, the intermediate semiconductor device 101 is illustrated following an etching process that recesses an electrically conductive material deposited on an upper surface of the buried insulator layer 104. The recessed electrically conductive material forms a gate handle 116 that encapsulates a portion of the thin dielectric layer 114 and a portion of the vertical semiconductor channel 110. The conductive handle 116 can be formed from various metal materials such as, for example, tungsten (W), and can be bulk deposited atop the buried oxide layer 104 so as to cover the buried oxide layer 104, the vertical channels 110 and the hardmask caps 112. After depositing the electrically conductive material, a timed RIE process can be performed to recess this electrically conductive material until reaching a desired height to form the gate handle 116 as further illustrated in FIG. 5. The gate handle 116 is also used as a mask that preserves the initial thickness (TH1) of a portion of the thin dielectric layer 114 when subsequently depositing a second thick dielectric layer (not shown in FIG. 5) that creates the split-channel gate dielectric described herein.

Figure 6:
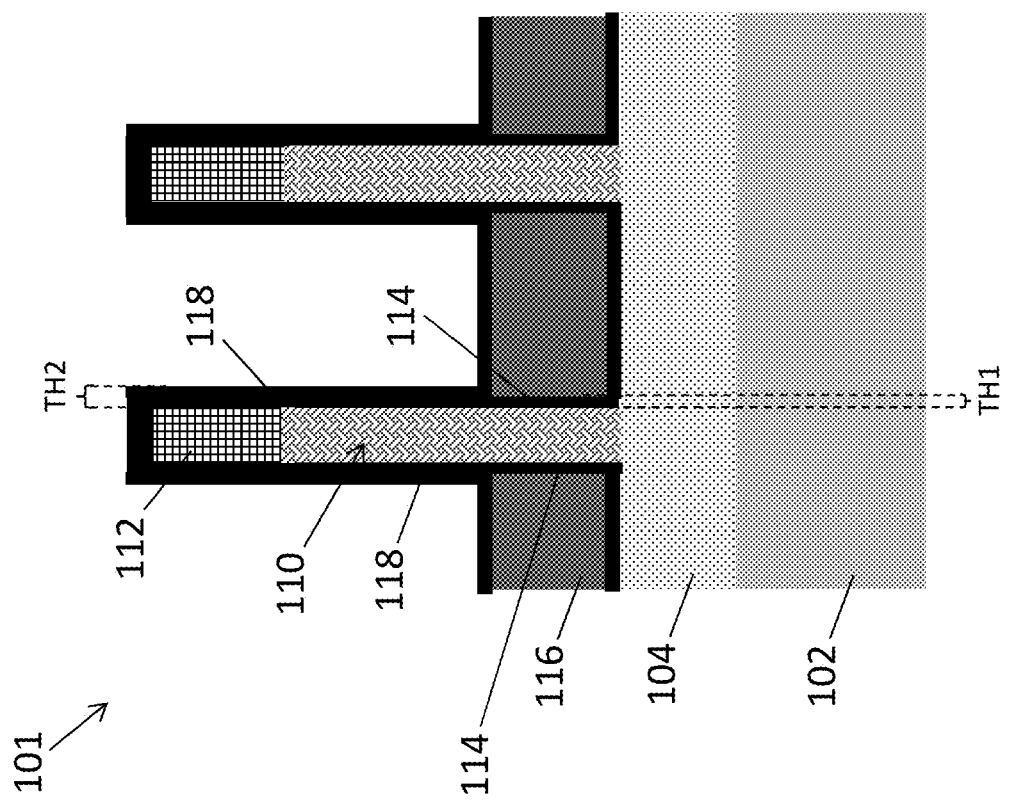

Turning to FIG. 6, the intermediate semiconductor device 101 is illustrated after forming a second dielectric layer 118 (i.e., thick dielectric layer 118) on an upper surface of the gate handle 116 and directly against the exposed portion of the thin dielectric layer 114. In this manner, the thick dielectric layer 118 is formed having a thickness (TH2) that is greater than the first thickness (TH1) of the thin dielectric layer 114. The thickness (TH2) of the thick dielectric layer 118 ranges from approximately 2 nm to approximately 4 nm. Similar deposition processes used to deposit the thin dielectric layer 114 described herein can be used to deposit the second dielectric layer 118.

The combination of the thin dielectric layer 114 and the thick dielectric layer 118 forms a split-channel gate dielectric having a varying thickness. The dielectric breakdown strength of a dielectric material is influenced by various characteristics such as, for example, the dielectric material and/or the dimensions of the dielectric (e.g., thickness). Accordingly, dielectric breakdown strength of the split-channel gate dielectric varies at different locations based on the varied thickness between the thin dielectric layer 114 and the thick dielectric layer 118.

For instance, the thinner dimension of the thin dielectric layer 114 creates a first dielectric breakdown strength that is less than a second dielectric breakdown strength created by the thicker dimensions of the thick dialectic layer 118. In this manner, a location of the dielectric breakdown of the split-channel gate dielectric can be controlled. At least one non-limiting embodiment illustrated in FIG. 6, for example, forces dielectric breakdown to occur in the thin dielectric layer 114 located near the buried insulator layer 104 instead of in the thick dielectric layer 118 near the upper surface of the device (i.e., near the upper end of the vertical channel opposite the buried insulator layer 104). Although dielectric breakdown occurs in the thin dielectric layer 114, the thick gate dielectric layer 118 still provides sensing capabilities while ensuring uniformity of the overall split-channel gate dielectric.

Figure 7:
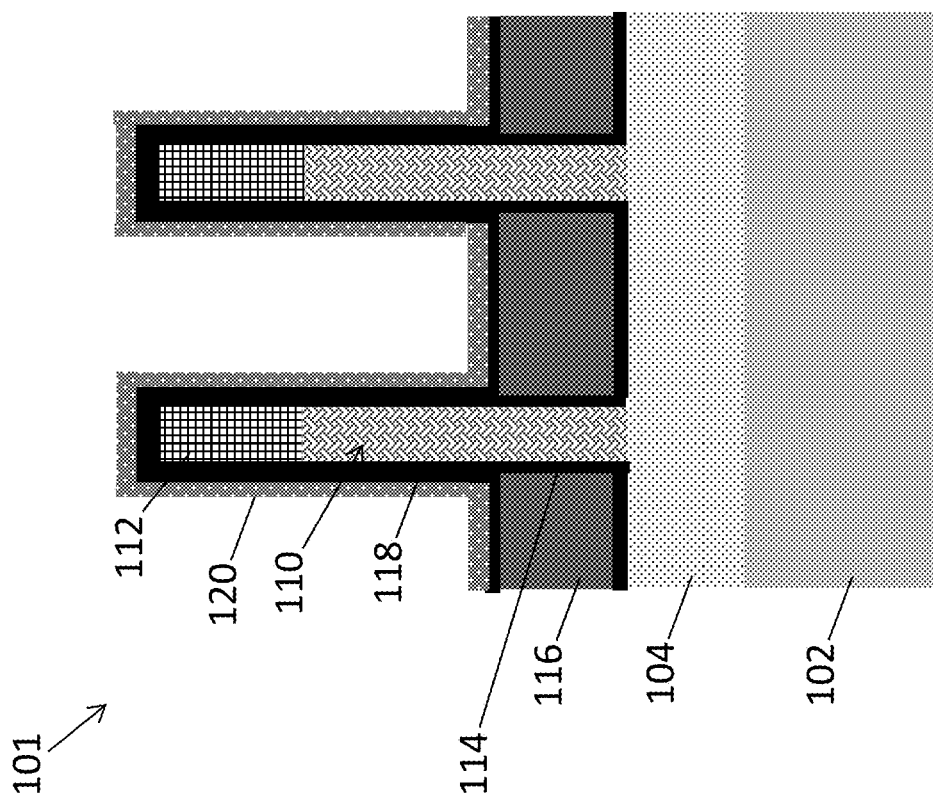

Turning now to FIG. 7, the intermediate semiconductor device 101 is illustrated following deposition of a masking liner 120. The masking liner 120 is deposited on the outer surface of the second dielectric layer 118. The thickness of the masking liner 120 ranges from approximately 20 nm to approximately 50 nm. The masking liner 120 can be formed of various nitride materials including, but not limited to, titanium nitride (TiN), and can be deposited using, for example, an chemical vapor deposition (CVD) process.

Figure 8:
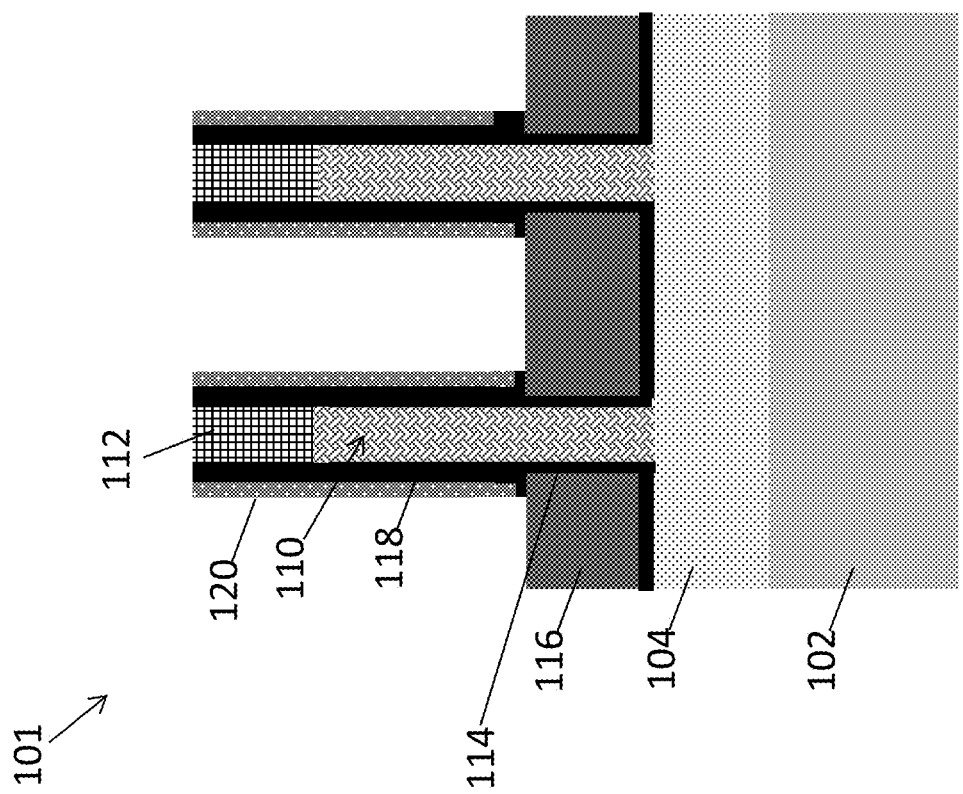

With reference now to FIG. 8, the intermediate semiconductor device 101 is illustrated following an etching process to selectively remove a portion of the thick dielectric layer 118 from the upper surface of the gate handle 116. For instance, a directional RIE process that is selective to the material of the thick dielectric layer 118 (e.g., $SiO_2$) can be performed. In this manner, a portion of the thick dielectric layer 118 is removed from the upper surface of the buried insulator layer 104 and the upper surface of the hardmask caps 112, while the masking liner 120 preserves the thickness (TH2) of the thick dielectric layer 118 formed on the sidewalls of the vertical channel 110.

Figure 9:
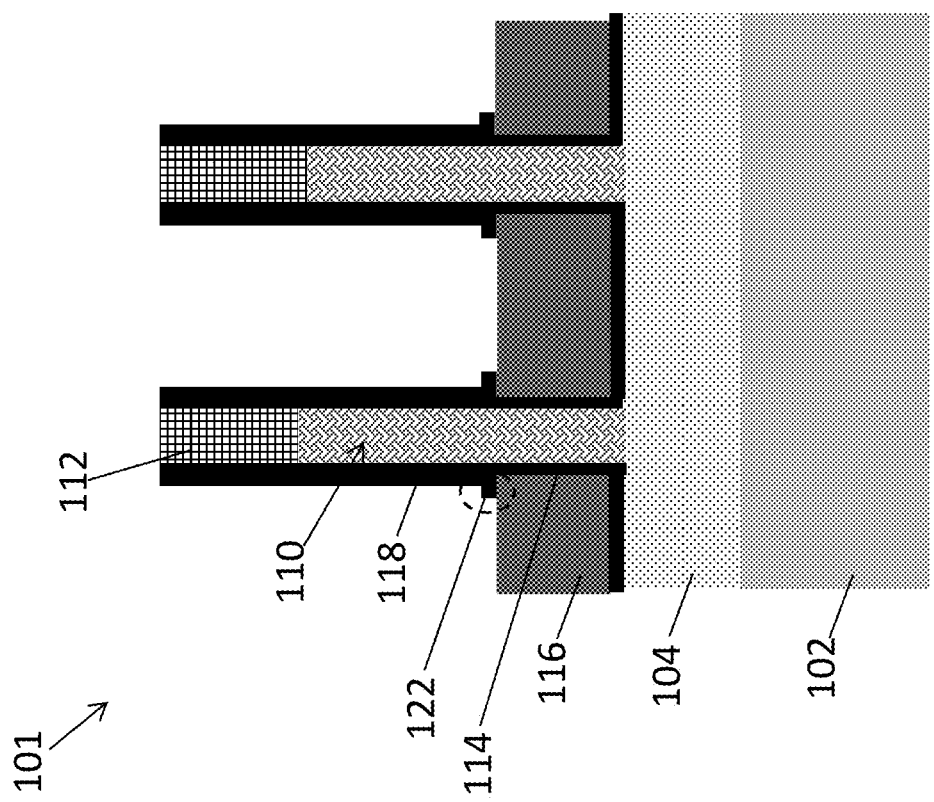

Referring now to FIG. 9, the intermediate semiconductor device 101 is illustrated after removing the remaining masking liner 120 from the thick dielectric layer 118. A wet etchant selective to the material of the masking liner 120 (e.g., TiN) can be used to remove the masking liner 120 without attacking the other materials of the semiconductor device 101. As further illustrated in FIG. 9, a flange portion 122 of the thick dielectric layer 118 is left remaining on an upper surface of the buried insulator layer 104 as a result of the sequence of fabrication processes described herein according to a non-limiting embodiment.

Figure 10:
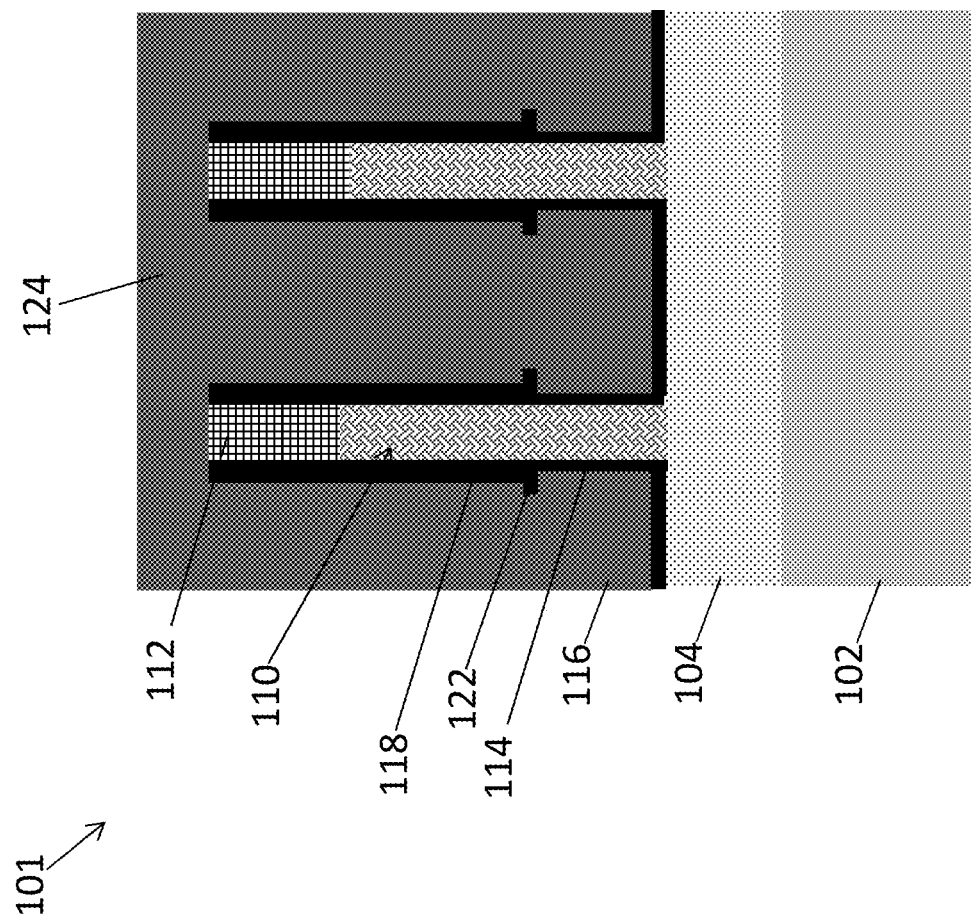

Turning to FIG. 10, the intermediate semiconductor device 101 is illustrated following deposition of a bulk electrically conductive filler material 124. The electrically conductive filler material 124 is deposited atop the gate handle 116 and covers the upper surface of the hardmask cap 112. The same metal material (e.g., W) used to form the gate handle 116 can be used as the bulk electrically conductive filler material 124.

Figure 11:
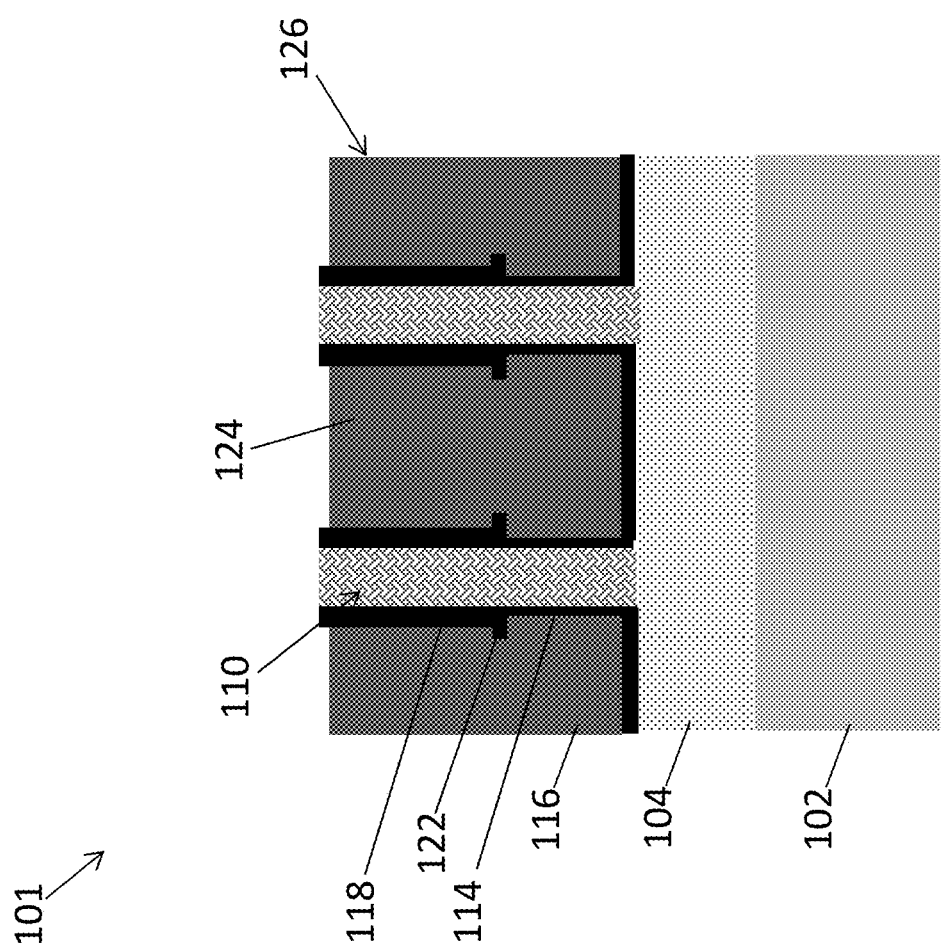

With reference to FIG. 11, the intermediate semiconductor device 101 is illustrated after recessing the electrically conductive filler material 124 to form an electrically conductive gate 126. A chemical-mechanical planarization (CMP) process can be performed to recess a portion of the electrically conductive filler material 124 until the hardmask caps 112 are removed. Although the electrically conductive filler material 124 is shown as being etched below the upper end of the thick dielectric layer 118, other embodiments allow for etching the electrically conductive filler material 124 while stopping on the upper surface of the thick dielectric layer 118. Accordingly, the upper surface of the electrically conductive filler material 124 is formed flush with the upper surface of the thick dielectric layer 118.

In either scenario, the intermediate semiconductor device 101 is formed such that the first dielectric layer 114 and the second dielectric layer 118 (i.e., the split-channel gate dielectric) is interposed between the vertical channel 110 and the gate 126. As further illustrated in FIG. 11, the lower end of the thin dielectric layer 114 contacts the upper surface of the buried insulator layer 104. The upper end of the thicker dielectric layer 118 is located adjacent to the upper surface of the gate 126, or in some embodiments is flush the upper surface of the gate 126. Dielectric breakdown is therefore forced to occur near the buried insulator layer 104 (i.e., in the thin dielectric layer 114) as opposed to near the upper surface of the gate 126. In this manner, leakage of current flowing through the resulting current path created by the dielectric breakdown (i.e., after programming of the antifuse device) can be reduced.

Figure 12:
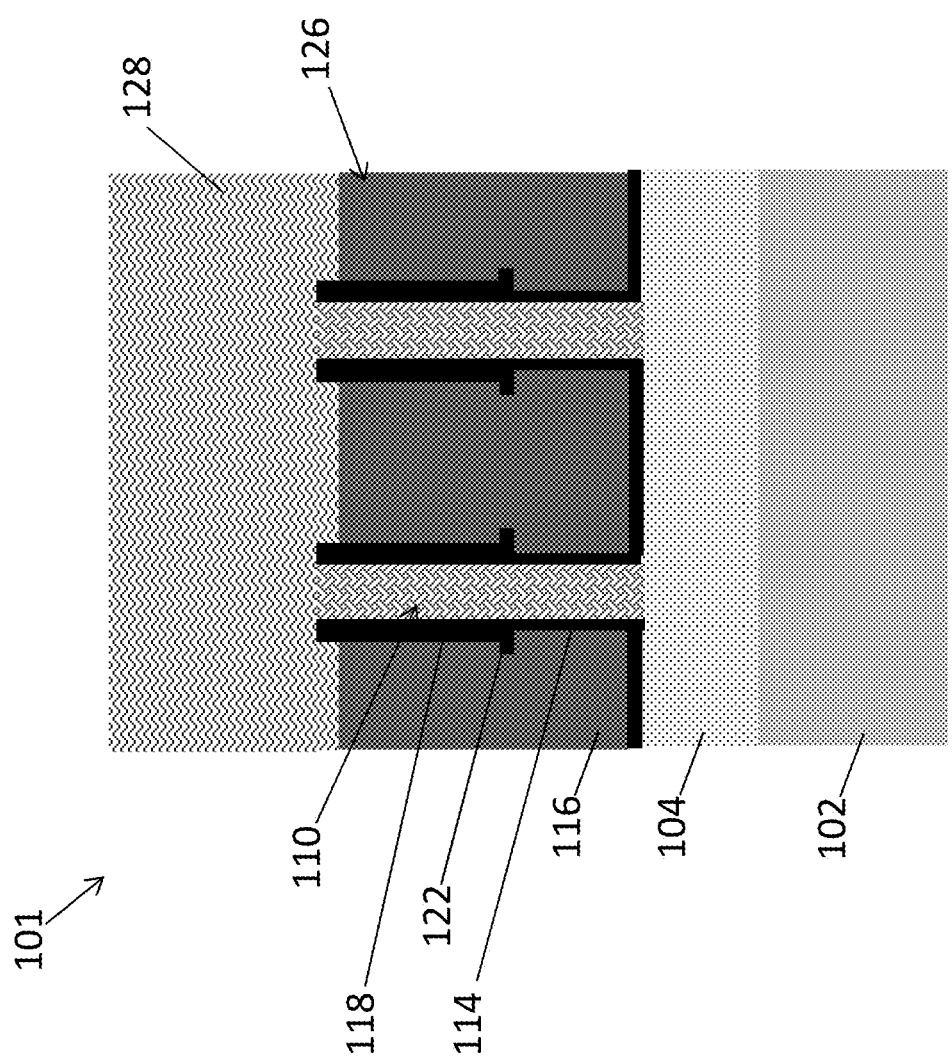

Referring to FIG. 12, the intermediate semiconductor device 101 is illustrated following deposition of a bulk spacer material 128. The bulk spacer material 128 is deposited on the upper surface the gate 126 so as to completely cover the vertical channel 110 and the thick dielectric layer 118. The bulk spacer material 128 can be formed from various materials including, but not limited to, an oxide material, a nitride material, silicon carbide (SiC), and can be deposited using a CVD process, for example.

Figure 13:
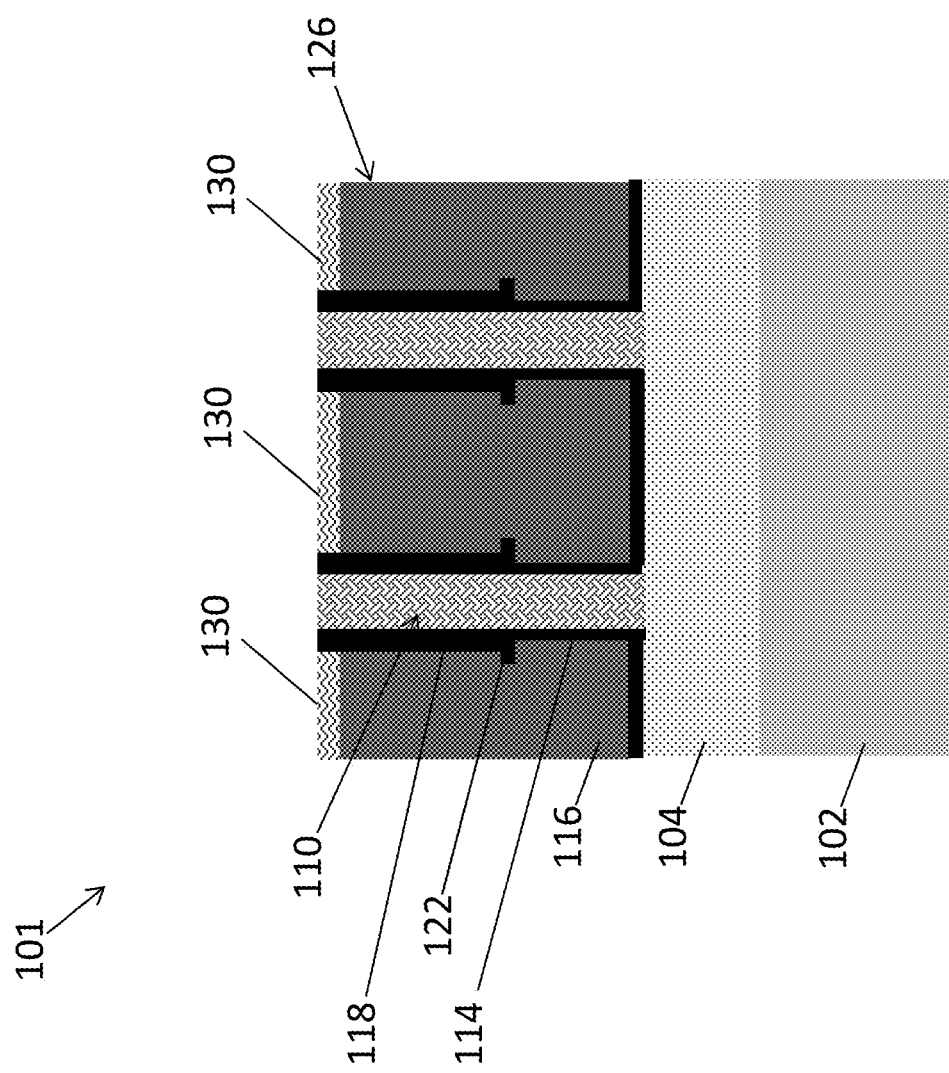

With reference to FIG. 13, the bulk spacer material 128 is recessed to form spacers 130 atop the gate 126. Various etching process can be used to recess the bulk spacer material 128 including, but not limited to, a CMP process. The spacers 130 are formed between the thick dielectric layers 118 and the gate 126 so as to electrically isolate the vertical channels 110 from the gate 126. The thickness of the spacers 130 ranges from approximately 8 nm to approximately 10 nm.

Figure 14:
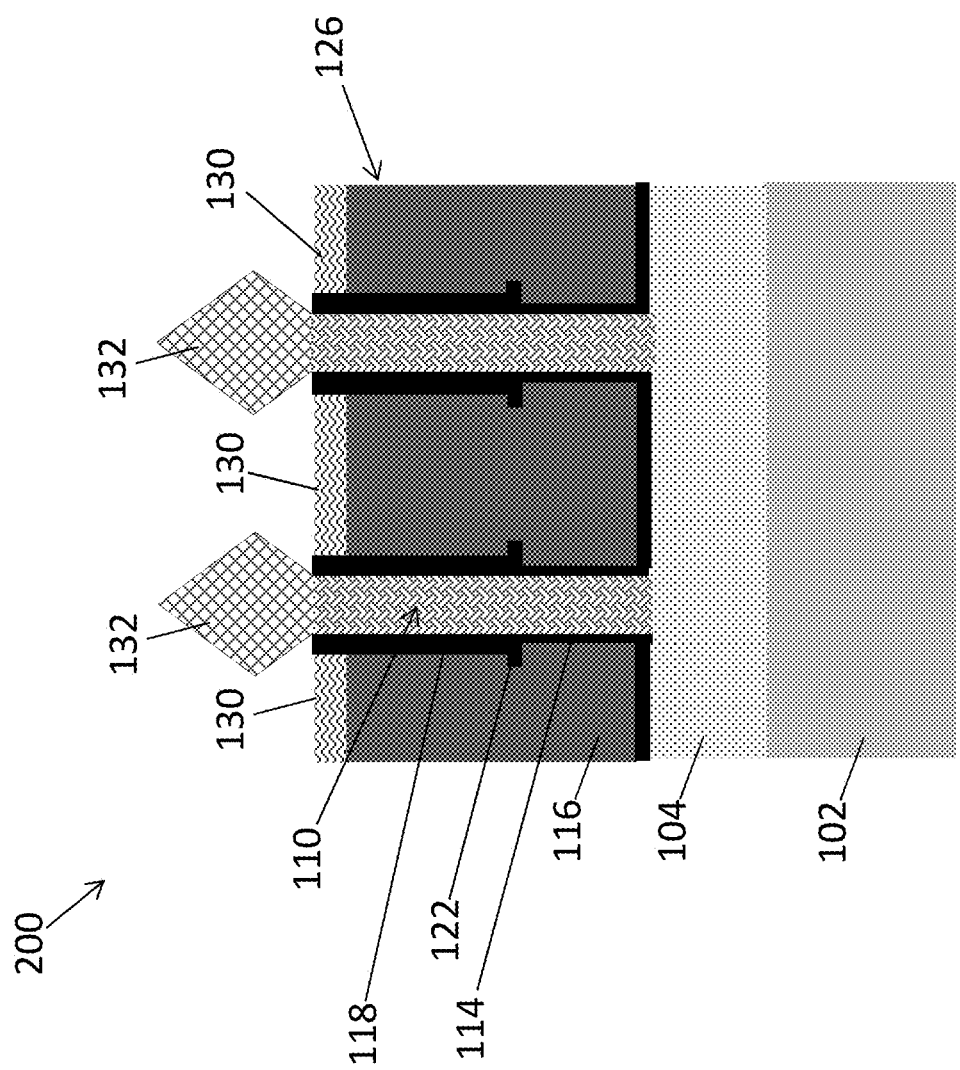

Referring to FIG. 14, an antifuse-integrated vertical FET 200 is illustrated following an epitaxially growth process to form a source/drain (S/D) region 132 atop the upper ends of the vertical channels 110. For example, in-situ doped silicon germanium (SiGe) can be epitaxially grown from the exposed upper surface of vertical channels 110, while the spacers 130 prevent any growth on the gate 126 and prevent shorting between the S/D regions 132 and the gate 126. The S/D regions 132 can be doped with boron (B) for a p-type device, while the S/D regions 132 for a n-type device can be doped with phosphorus (P). The epitaxy process used to form S/D regions 132 can be carried out using various well-known techniques including, but not limited to, vapor phase epitaxy (VPE), molecular beam epitaxy (MBE) or liquid phase epitaxy (LPE) with a gaseous or liquid precursor, such as, for example, silicon tetrachloride. In memory cell applications, each S/D region 132 functions as a bit line while the gate 126 functions as a word line.

Figure 15:
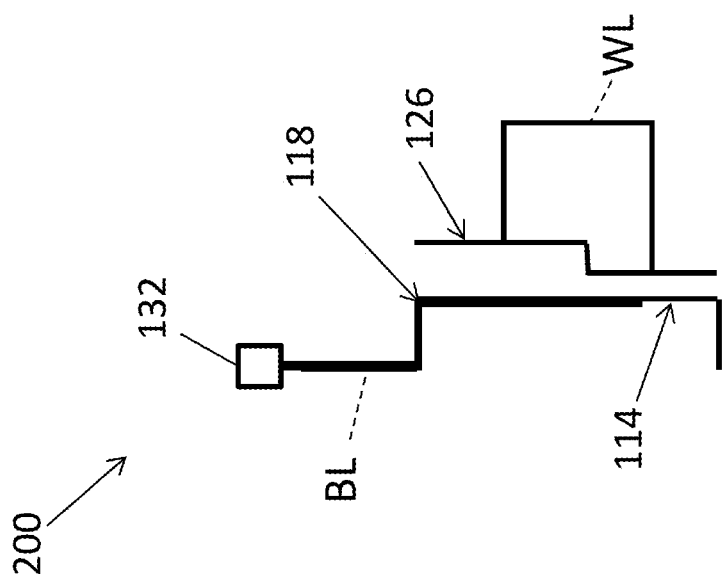

The antifuse-integrated vertical FET 200 device discussed herein is configured to operate in a non-programmed mode and a programmed mode. FIG. 15 is a schematic diagram of the antifuse-integrated vertical FET 200 operating in the non-programmed mode. The non-programmed mode exists when the split-channel gate dielectric is intact (i.e., dielectric breakdown of the thin dielectric layer 114 has not occurred). During the non-programmed mode, the antifuse-integrated vertical FET 200 operates as a metal-oxide-semiconductor (MOS) capacitor. Accordingly, no current is sensed at the bit line (BL), i.e., the S/D regions 132.

Figure 16:
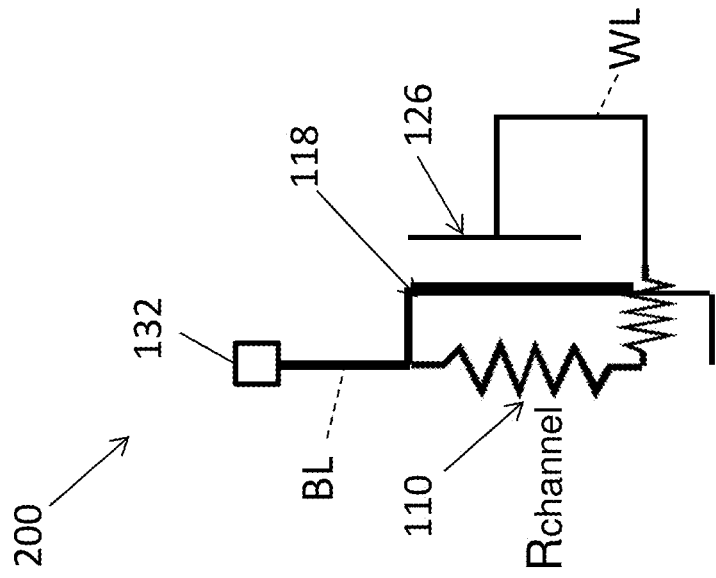

Turning to FIG. 16, a schematic diagram shows the antifuse-integrated vertical FET 200 operating in the programmed mode. The programmed mode is invoked when the split-channel gate dielectric experiences dielectric breakdown, which in terms of the antifuse-integrated vertical FET 20 device described above involves dielectric breakdown of the thin dielectric layer 114. The breakdown creates an electrically conductive path to the vertical channel 110. Accordingly, the antifuse-integrated vertical FET 200 operates as a MOS diode transistor with a channel resistance ($R_{CHANNEL}$) such that current can be measured at bit line (BL), i.e., the S/D regions 132. In other words, after programming occurs (i.e., the thin dielectric layer 114 breaks down), the antifuse-integrated vertical FET 200 still operates as a transistor and the current measured at bit line (i.e., S/D region 132) is equivalent to the on-current of the transistor influenced by the thick dielectric layer 118.

As described in detail above, at least one non-limiting embodiment provides a vertical FET having an integrated antifuse device with a split-channel gate dielectric. The split-channel gate dielectric includes a thin gate dielectric layer and a thick gate dielectric layer which controls dielectric breakdown to mitigate current leakage after programming. In addition, the structure of the antifuse-integrated vertical FET achieves a reduced footprint compared to conventional antifuse devices. Accordingly, the vertical FET described herein facilitates the advancement of SOC applications that employ high-density component layouts.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of integrating an antifuse device with a vertical field effect transistor (FET), the method comprising:
    forming a vertical semiconductor channel on an upper surface of a semiconductor substrate;
    forming a split-channel gate dielectric on the outer surface of the vertical semiconductor channel;
    forming an electrically conductive gate that encapsulates the split-channel gate dielectric and the vertical semiconductor channel; and
    epitaxially growing a source/drain region from a first end of the vertical channel region located opposite a second end of the vertical channel region that contacts the upper surface of the semiconductor substrate,
    wherein forming the split-channel gate dielectric includes forming a first dielectric layer having a first thickness and forming a second dielectric layer having a second thickness greater than the first thickness.

2. The method of claim 1, wherein forming the split-channel gate dielectric further includes forming the first dielectric layer on an upper surface of the semiconductor substrate.

3. The method of claim 2, wherein forming the split-channel gate dielectric further comprises forming the second dielectric layer between the first dielectric layer and the source/drain region.

4. The method of claim 1, wherein forming the first and second dielectric layers comprises depositing the first dielectric layer having the first thickness on the outer surface of vertical semiconductor channel.

5. The method of claim 4, wherein forming the first and second dielectric layers further comprises depositing a first electrically conductive material on an upper surface of the semiconductor substrate.

6. The method of claim 5, wherein the first electrically conductive material encapsulates a portion of the first dielectric layer and a portion of the vertical semiconductor channel.

7. The method of claim 5, wherein forming the first and second dielectric layers further comprises depositing the second dielectric layer directly on an upper surface of the first electrically conductive material.

8. The method of claim 7, wherein forming the first and second layers further comprises depositing the second dielectric layer directly against an exposed portion of the first dielectric layer so as to define the second thickness.

9. The method of claim 8, wherein forming the first and second dielectric layer further comprises depositing a second electrically conductive material on an upper surface of the first electrically conductive material to encapsulate the second dielectric layer and the vertical semiconductor channel so as to form the electrically conductive gate.

10. The method of claim 1, wherein the first thickness defines a first dielectric breakdown strength and the second thickness defines a second dielectric breakdown strength greater than the first dielectric breakdown strength.

* * * * *